United States Patent
Atsuji et al.

(10) Patent No.: US 10,863,587 B2
(45) Date of Patent: Dec. 8, 2020

(54) CERAMIC STRUCTURE, METHOD FOR MANUFACTURING THE SAME, AND MEMBER FOR SEMICONDUCTOR MANUFACTURING APPARATUS

(71) Applicant: NGK INSULATORS, LTD., Nagoya (JP)

(72) Inventors: Kyohei Atsuji, Nagoya (JP); Noboru Nishimura, Nagoya (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 761 days.

(21) Appl. No.: 15/425,098

(22) Filed: Feb. 6, 2017

(65) Prior Publication Data

US 2017/0251524 A1    Aug. 31, 2017

(30) Foreign Application Priority Data

Feb. 29, 2016    (JP) .................. 2016-037658

(51) Int. Cl.
  *H05B 3/28*    (2006.01)
  *C04B 37/00*   (2006.01)
  (Continued)

(52) U.S. Cl.
  CPC ........... *H05B 3/283* (2013.01); *C04B 35/581* (2013.01); *C04B 35/645* (2013.01);
  (Continued)

(58) Field of Classification Search
  CPC ................ H05B 3/283; H05B 1/0233; H05B 2203/013; H05B 2203/016;
  (Continued)

(56) References Cited

U.S. PATENT DOCUMENTS 6,133,557 A * 10/2000 Kawanabe ........ H01L 21/67103
                                                      219/544
7,701,693 B2 * 4/2010 Hattori .................. C04B 37/001
                                                      361/234
(Continued)

FOREIGN PATENT DOCUMENTS

CN    103857643 A    6/2014
JP    2005-018992 A    1/2005
(Continued)

OTHER PUBLICATIONS

Japanese Office Action (with English translation), Japanese Application No. 2016-037658, dated Sep. 3, 2019.
(Continued)

*Primary Examiner* — Ibrahime A Abraham
*Assistant Examiner* — Chris Q Liu
(74) *Attorney, Agent, or Firm* — Burr & Brown, PLLC

(57) ABSTRACT

A ceramic structure 10 includes a heater electrode 14 within a disk-shaped AlN ceramic substrate 12. The heater electrode 14 contains a metal filler in the main component WC. The metal filler (such as Ru or RuAl) has a lower resistivity and a higher thermal expansion coefficient than AlN. An absolute value of a difference |ΔCTE| between a thermal expansion coefficient of the AlN ceramic substrate 12 and a thermal expansion coefficient of the heater electrode 14 at a temperature in the range of 40° C. to 1000° C. is 0.35 ppm/° C. or less.

7 Claims, 3 Drawing Sheets

(51) Int. Cl.

| | |
|---|---|
| C04B 35/645 | (2006.01) |
| C04B 35/581 | (2006.01) |
| H05B 3/26 | (2006.01) |
| H01L 21/67 | (2006.01) |
| H05B 3/14 | (2006.01) |
| C04B 37/02 | (2006.01) |
| H05B 1/02 | (2006.01) |
| H05B 3/12 | (2006.01) |

(52) U.S. Cl.
CPC .......... *C04B 37/001* (2013.01); *C04B 37/021* (2013.01); *H01L 21/67103* (2013.01); *H05B 1/0233* (2013.01); *H05B 3/12* (2013.01); *H05B 3/143* (2013.01); *H05B 3/265* (2013.01); *C04B 2235/3225* (2013.01); *C04B 2235/5445* (2013.01); *C04B 2235/6562* (2013.01); *C04B 2235/6586* (2013.01); *C04B 2235/72* (2013.01); *C04B 2235/723* (2013.01); *C04B 2237/366* (2013.01); *C04B 2237/408* (2013.01); *C04B 2237/68* (2013.01); *C04B 2237/84* (2013.01); *H05B 2203/013* (2013.01); *H05B 2203/017* (2013.01)

(58) Field of Classification Search
CPC .... H05B 2203/017; H05B 3/12; H05B 3/143; H05B 3/265; H05B 3/28; H05B 3/748; C04B 2235/3217; C04B 2235/5445; C04B 2235/77; C04B 35/111; C04B 2235/9607; C04B 2237/343; C04B 35/581; C04B 35/645; C04B 2235/3225; C04B 2235/36; C04B 2235/3865; C04B 2235/6025; C04B 2235/6562; C04B 2235/6567; C04B 2235/6586; C04B 2235/72; C04B 35/491; C04B 37/001; C04B 2235/3206; C04B 2235/3222; C04B 2235/3251; C04B 2235/3258; C04B 2235/3262; C04B 2235/3281; C04B 2235/3294; C04B 2235/5436; C04B 2235/604; C04B 2235/608; C04B 2235/76; C04B 2235/786; C04B 2235/80; C04B 2235/96; C04B 2235/08; C04B 2235/34; C04B 2235/366; C04B 2237/68; C04B 35/053; C04B 35/48; C04B 35/505; C04B 35/5626; C04B 35/58; C04B 35/62695; C04B 37/005; C04B 2235/3208; C04B 2235/3224; C04B 2235/3227; C04B 2235/3244; C04B 2235/3246; C04B 2235/3256; C04B 2235/3267; C04B 2235/3418; C04B 2235/3895; C04B 2235/422; C04B 2235/445; C04B 2235/449; C04B 2235/528; C04B 2235/5427; C04B 2235/5481; C04B 2235/602; C04B 2235/6021; C04B 2235/6023; C04B 2235/606; C04B 2235/656; C04B 2235/6565; C04B 2235/6581; C04B 2235/6584; C04B 2235/721; C04B 2235/723; C04B 2235/768; C04B 2235/79; C04B 2235/85; C04B 2235/94; C04B 2235/9615; C04B 2235/963; C04B 2235/9638; C04B 2235/9661; C04B 2237/064; C04B 2237/10; C04B 2237/122; C04B 2237/36; C04B 2237/408; C04B 2237/595; C04B 2237/66; C04B 2237/72; C04B 2237/84; C04B 35/117; C04B 35/119; C04B 35/493; C04B 35/6263; C04B 35/62655; C04B 35/62685; C04B 35/6342; C04B 35/6365; C04B 35/638; C04B 37/006; C04B 37/021

USPC ... 219/444.1, 544, 553, 121.52, 121.36, 543
See application file for complete search history.

(56) References Cited

U.S. PATENT DOCUMENTS

| | | | |
|---|---|---|---|
| 2006/0073349 A1* | 4/2006 | Aihara | C04B 35/117 428/469 |
| 2009/0159007 A1 | 6/2009 | Morooka | |
| 2014/0231019 A1* | 8/2014 | Kajihara | H01L 21/67103 156/345.51 |
| 2014/0284320 A1* | 9/2014 | Nobori | B32B 18/00 219/553 |
| 2014/0285943 A1* | 9/2014 | Watanabe | H01L 21/6833 361/234 |
| 2014/0290863 A1 | 10/2014 | Watanabe et al. | |
| 2014/0292156 A1* | 10/2014 | Kashiwaya | C04B 41/52 310/364 |

FOREIGN PATENT DOCUMENTS

| | | |
|---|---|---|
| JP | 5032444 B2 | 9/2012 |
| JP | 2014-185053 A | 10/2014 |
| WO | 2013/054806 A1 | 4/2013 |

OTHER PUBLICATIONS

Japanese Office Action (with English translation), Japanese Application No. 2016-037658, dated Mar. 17, 2020 (8 pages).
Chinese Office Action (with English translation), Chinese Application No. 201710073140.5, dated Jun. 5, 2020 (16 pages).

* cited by examiner

CERAMIC STRUCTURE, METHOD FOR MANUFACTURING THE SAME, AND MEMBER FOR SEMICONDUCTOR MANUFACTURING APPARATUS

BACKGROUND OF THE INVENTION

1. Field of the Invention

The present invention relates to a ceramic structure, a method for manufacturing the ceramic structure, and a member for a semiconductor manufacturing apparatus.

2. Description of the Related Art

Members having a heater function for use in semiconductor manufacturing apparatuses are frequently used in the manufacture of elements and devices, such as semiconductors, by precision processing of plate-like materials, such as silicon substrates, glass substrates, and various single-crystal substrates. Patent Literature 1 discloses an AlN ceramic substrate with an internal heater electrode as such a member for a semiconductor manufacturing apparatus. Patent Literature 1 discloses the use of a sinter of an electrically conductive paste containing tungsten carbide (WC) as a heater electrode and discloses that the inclusion of approximately 5% by weight to approximately 30% by weight of a ceramic material in a heater electrode preferably results in similar thermal expansion coefficients of the heater electrode and an AlN ceramic substrate.

CITATION LIST

Patent Literature

PTL: JP 5032444 B

SUMMARY OF THE INVENTION

Although the use of WC containing AlN ceramic as a material of a heater electrode results in similar thermal expansion coefficients of the heater electrode and an AlN ceramic substrate and can therefore reduce the likelihood of cracking or breakage during sintering, the following problems may occur. When WC containing AlN ceramic is used as a material of a heater electrode, because AlN is an insulator, the heater electrode has a higher resistivity than heater electrodes made of WC not containing AlN ceramic and generates a smaller amount of heat than the heater electrodes at the same voltage.

The present invention has been made to solve such problems and principally aims to provide a ceramic structure that includes an AlN ceramic substrate including an internal heater electrode containing WC as the main component, is less likely to cause cracking or breakage, and can generate a large amount of heat.

A ceramic structure according to the present invention is a ceramic structure that includes a heater electrode on a surface of or within an AlN ceramic substrate. The heater electrode contains a metal filler in the main component WC. The metal filler has a lower resistivity and a higher thermal expansion coefficient than AlN. The absolute value of the difference between the thermal expansion coefficient of the AlN ceramic substrate and the thermal expansion coefficient of the heater electrode at a temperature in the range of 40° C. to 1000° C. is 0.35 ppm/° C. or less.

A member for a semiconductor manufacturing apparatus according to the present invention includes the ceramic structure.

A method for manufacturing a ceramic structure according to the present invention includes placing a heater electrode or heater electrode precursor containing a metal filler in WC on a surface of a first substrate of an aluminum nitride sintered body, calcined body, or formed body, placing a second substrate of an aluminum nitride sintered body, calcined body, or formed body thereon to form a layered body, and hot-press firing the layered body to form the ceramic structure.

In a ceramic structure according to the present invention, a heater electrode contains a metal filler having a lower resistivity and a higher thermal expansion coefficient than AlN in the main component WC and therefore has a similar resistivity to WC. Thus, the heater electrode can generate a similar amount of heat to heater electrodes made of WC at a predetermined voltage. The absolute value of the difference between the thermal expansion coefficient of the AlN ceramic substrate and the thermal expansion coefficient of the heater electrode at a temperature in the range of 40° C. to 1000° C. is as small as 0.35 ppm/° C. or less. This can reduce the likelihood of cracking or breakage during sintering.

A member for a semiconductor manufacturing apparatus according to the present invention includes the ceramic structure and therefore has the same advantages as the ceramic structure.

A method for manufacturing a ceramic structure according to the present invention is suitable to manufacture the ceramic structure.

DETAILED DESCRIPTION OF THE INVENTION

Figure 1:
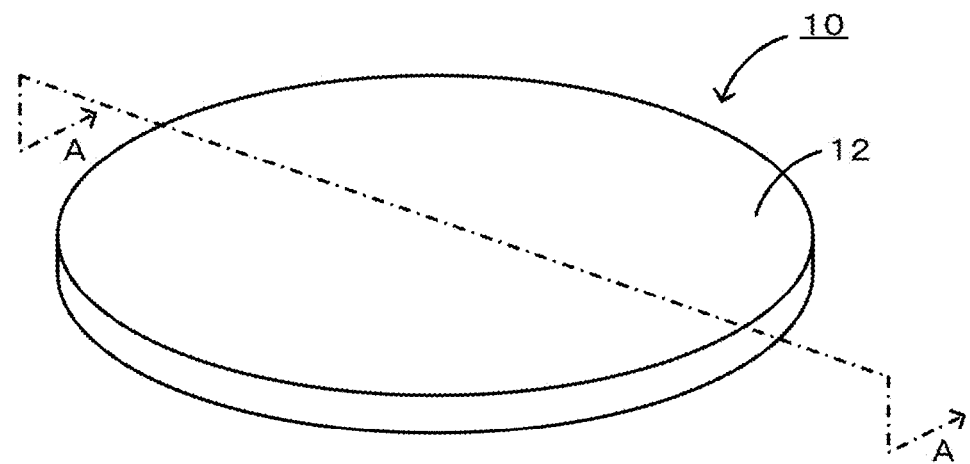
FIG. 1 is a perspective view of a ceramic structure 10.

A ceramic structure according to the present invention includes a heater electrode on a surface of or within an AlN ceramic substrate.

The AlN ceramic substrate is a sintered body containing AlN as the main component and has a thermal expansion coefficient in the range of 5.5 to 6.0 ppm/° C., preferably 5.6 to 5.8 ppm/° C., at a temperature in the range of 40° C. to 1000° C. In addition to AlN, the AlN ceramic substrate may contain a component derived from a sintering aid. The sintering aid for AlN is a rare-earth metal oxide, for example. The rare-earth metal oxide is preferably $Y_2O_3$ or $Yb_2O_3$. The "main component" refers to a component constituting 50% or more by volume (preferably 70% or more by volume, more preferably 85% or more by volume) or a component having the highest volume percentage of all the components (the same applies hereinafter).

The heater electrode is a WC electrode containing a metal filler. The heater electrode contains the metal filler in the main component WC, and the metal filler generally has a lower resistivity than AlN. Thus, the heater electrode has a similar resistivity to WC (preferably 0.5 to 2 times, more preferably 0.8 to 1.5 times, the resistivity of WC) and can generate a similar amount of heat to heater electrodes made of WC at a predetermined voltage. WC has a thermal expansion coefficient in the range of 5.2 to 5.4 ppm/° C. at a temperature in the range of 40° C. to 1000° C. The metal filler content is determined such that the absolute value of the difference |ΔCTE| between the thermal expansion coefficient of the ceramic substrate and the thermal expansion coefficient of the WC electrode containing the metal filler at a temperature in the range of 40° C. to 1000° C. is preferably 0.35 ppm/° C. or less, more preferably 0.25 ppm/° C. or less. The metal filler is preferably a high-melting-point metal filler having a thermal expansion coefficient of 7.0 ppm/° C. or more at a temperature in the range of 40° C. to 1000° C. This is because such a metal filler enables one to easily adjust |ΔCTE| to be 0.35 ppm/° C. or less. The metal filler may be, but is not limited to, a metal selected from the group consisting of Ru, Ta, Nb, Rh, and Pt, an alloy thereof, or a mixture of different two or more of the metals and alloys thereof. Among these, Ru is preferred as a metal, and a Ru alloy is preferred as an alloy. This is because Ru or a Ru alloy enables one to more easily adjust |ΔCTE| to be 0.35 ppm/° C. or less and, due to its low resistivity, can easily achieve resistivity more similar to the resistivity of WC. The Ru alloy may be RuAl, RuTi, or RuZr, RuAl being preferred. In a WC powder containing a metal filler of Ru, WC and Ru tend to separate into layers during a firing process, and the thermal expansion coefficient and resistivity in a heater electrode sometimes lack sane uniformity. By contrast, in a WC powder containing RuAl, such separation during a firing process does not occur, and the RuAl filler can be dispersed in the WC electrode, thus resulting in a more uniform thermal expansion coefficient and resistivity in a heater electrode. The heater electrode preferably has a resistivity of $3.0 \times 10^{-5}$ Ωcm or less, more preferably $2.5 \times 10^{-5}$ Ωcm or less, at roan temperature. The specific example of the metal filler described above is also suitable to set the resistivity of the heater electrode at room temperature in the numerical range described above.

Figure 2:
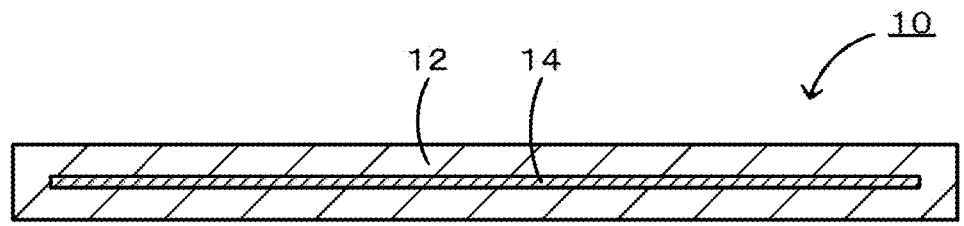
FIG. 2 is a cross-sectional view taken along the line A-A of FIG. 1.
Figure 3A:
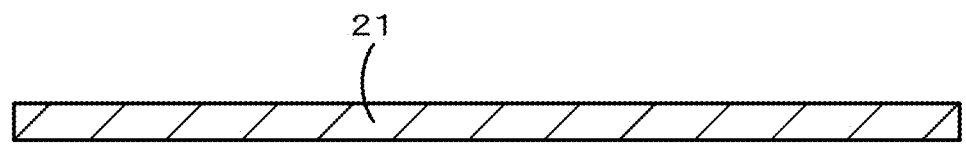
FIGS. 3A to 3D illustrate a method for manufacturing the ceramic structure 10.
Figure 3B:
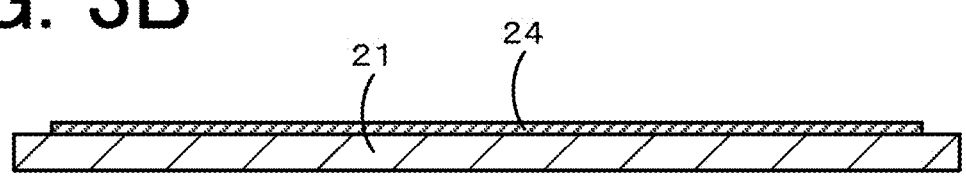
Figure 3C:
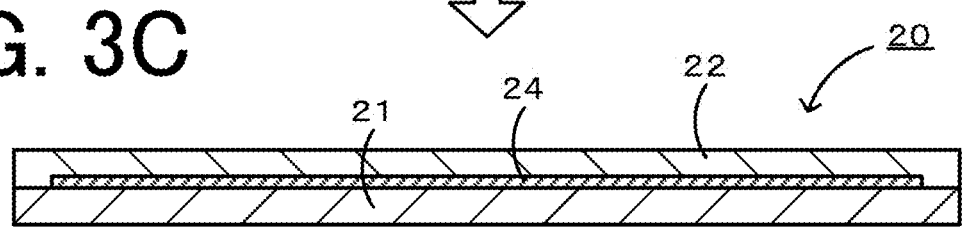
Figure 3D:
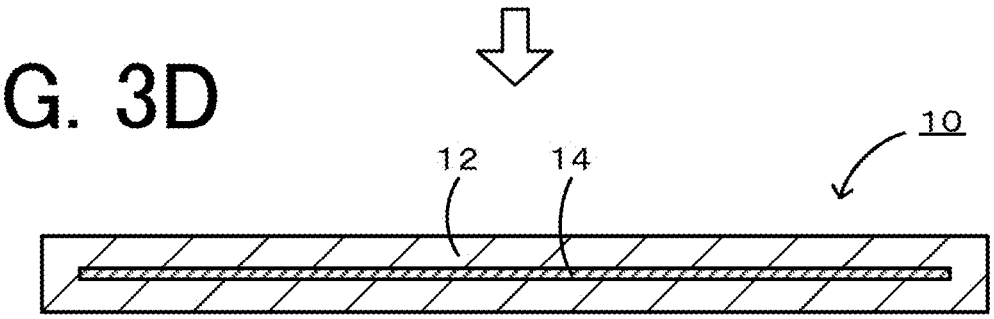

FIGS. 1 and 2 illustrate a ceramic structure according to an embodiment of the present invention. FIG. 1 is a perspective view of a ceramic structure 10, and FIG. 2 is a cross-sectional view taken along the line A-A of FIG. 1. The ceramic structure 10 includes a heater electrode 14 within a disk-shaped AlN ceramic substrate 12. The heater electrode 14 may have a sheet form or may be patterned with a single continuous line over the entire plane. The heater electrode 14 may include a plurality of sheet-like or patterned electrodes. FIG. 3 illustrate a method for manufacturing the ceramic structure 10. In this manufacturing method, an AlN ceramic sintered body is prepared as a first substrate 21 (see FIG. 3A). An electrode paste is then printed in a predetermined electrode pattern on a top surface of the first substrate 21 to form a heater electrode precursor 24 (see FIG. 3B). The electrode paste is produced by mixing and kneading a mixed powder of a WC powder and a metal filler with an organic solvent and a binder. The heater electrode precursor 24 is then covered with an AlN ceramic formed body 22 serving as a second substrate 22 to form a layered body 20 (see FIG. 3C). The layered body 20 is then hot-press fired to sinter the AlN ceramic formed body 22 and the heater electrode precursor 24, thereby integrating the first substrate 21, the second substrate 22, and the heater electrode 14 to complete the ceramic structure 10 (see FIG. 3D). The firing temperature (maximum temperature) of the hot-press firing preferably ranges from 1700° C. to 2000° C., more preferably 1750° C. to 1900° C. The pressing pressure preferably ranges from 50 to 300 kgf/cm². The firing atmosphere preferably does not affect the firing of the raw materials and is preferably an inert atmosphere, such as a nitrogen atmosphere or an argon atmosphere, or a vacuum atmosphere. The forming pressure may be any pressure at which the ceramic structure 10 can maintain its shape.

In the manufacturing method, the first substrate 21 may be an AlN ceramic calcined body or formed body instead of the AlN ceramic sintered body. The second substrate 22 may be an AlN ceramic calcined body or an AlN ceramic sintered body instead of the AlN ceramic formed body. In the case where the first and second substrates 21 and 22 are AlN calcined bodies, the AlN calcined bodies can improve shape retention compared with the formed body of the mixed powder and make handling (holding) easier. This facilitates printing of an electrode precursor on a calcined body surface or the placement of an electrode and enables one to manufacture a ceramic structure or a ceramic layered body by a single hot-press firing step or fewer firing steps. The heater electrode precursor 24 may be replaced by a heater electrode 14 having a predetermined shape formed by a cutting process, such as punching. Furthermore, the first substrate 21 may be replaced by the ceramic structure 10 or the layered body 20 to manufacture a ceramic structure including multi-layer electrodes. Although the ceramic structure 10 includes the heater electrode 14 within the ceramic substrate 12, the heater electrode 14 may be disposed on a surface of the ceramic substrate 12. In addition to the heater electrode 14, the ceramic structure 10 may include an electrostatic chuck electrode and/or a high-frequency electrode.

A member for a semiconductor manufacturing apparatus according to the present invention includes the ceramic structure. The member for a semiconductor manufacturing apparatus may be, but is not limited to, a ceramic heater or an electrostatic chuck heater.

EXAMPLES (1) Method for Manufacturing Ceramic Structure (1-1) Preparation of First Substrate (1-1-1) Preparation of Raw Powders A commercially available high-purity fine powder (oxygen content: 0.9%, impurity component other than oxygen: 0.1% or less, average particle size: 1.1 μm) was used as an AlN raw material. A commercially available high-purity fine powder (purity: 99.9% or more, average particle size: 1 μm) was used as a $Y_2O_3$ raw material. The AlN raw material and the $Y_2O_3$ raw material weighed at a mass ratio in the range of 95:5 to 100:0, together with φ20-mm iron-core nylon cobblestones, were wet-blended in an alcohol solvent in a nylon pot for 4 hours. After blending, the resulting slurry was removed and was dried in a nitrogen stream at 110° C. The dried product was passed through a 30-mesh sieve to prepare a blended powder.

(1-1-2) Manufacture of Disk-Shaped Formed Body

The powder prepared in (1-1-1) was uniaxially pressed at a pressure of 200 kgf/cm² to form a disk-shaped formed body having a diameter of approximately 50 mm and a thickness of approximately 10 mm. The formed body was used as a second substrate in Experimental Examples 1 to 22.

(1-1-3) Firing of Disk-Shaped Formed Body

The disk-shaped formed body formed in (1-1-2) was placed in a graphite mold for hot pressing. The graphite old was placed in a hot pressing furnace and was held at a pressing pressure of 200 kgf/cm² and at a firing temperature (maximum temperature) in the range of 1750° C. to 1900°

C. for 4 hours to form a sintered body. The heating rate and cooling rate were 300° C./h respectively. The hot pressing furnace was evacuated during heating to 1000° C. and was then charged with nitrogen gas. After that, the gas pressure was maintained at approximately 1.5 atm. While the temperature was decreased, the temperature control was stopped at 1400° C., and the furnace cooling was performed. The sintered body was processed to have a diameter of approximately 50 mm and a thickness of approximately 5 mm and was used as a first substrate in Experimental Examples 1 to 22.

(1-1-4) Manufacture of Disk-Shaped Calcined Body

A disk-shaped formed body was formed by the method described in (1-1-2) and was heated in an inert atmosphere at a temperature in the range of approximately 800° C. to 1000° C. for approximately 1 hour to manufacture a disk-shaped calcined body. The calcined body had an outer diameter of φ50 mm and a thickness of approximately 10 mm. The calcined body was used as a first substrate and a second substrate in Experimental Examples 23 to 25. The calcined body may be manufactured by another method, including an existing method, for example, by adding forming aids, such as an organic binder, to a raw powder, shaping the raw powder to form a formed body, and heating the formed body.

(1-2) Preparation of Electrode Paste

A WC powder used as the main component of a heater electrode was a commercial product having a purity of 99.9% and an average particle size of approximately 0.8 μm. The following components were added to the heater electrode. A commercial product of Ru was wet-ground to an average particle size of 2 μm and was used as a Ru powder. Al was a commercial product having a purity of 99.7% or more and an average particle size of approximately 10 μm. The Ru powder and the Al powder were mixed at a mole ratio of 1:1, was converted into a RuAl alloy at 1100° C. in an Ar atmosphere, was wet-ground to an average particle size of 2 μm, and was used as a RuAl alloy powder. An electrode paste was prepared by sufficiently mixing the WC powder and the additive components at a predetermined ratio in each experimental example and mixing and kneading the mixed powder with an organic solvent and a binder. The organic solvent was butyl carbitol, and the binder was poly(n-butyl methacrylate). The electrode paste was printed on a top surface of the first substrate through a screen to form a plurality of lines having a width of 5 mm and a length of 15 mm. The electrode paste had a thickness in the range of approximately 60 to 70 μm. After printing, the electrode paste was dried in the air for approximately 1 hour.

(1-3) Placement of Second Substrate

The second substrate was placed on the electrode paste printed surface of the first substrate prepared in (1-2) to form a layered body. In the case where the first substrate was the fired body formed in (1-1-3), the formed body formed in (1-1-2) was used as the second substrate. In the case where the first substrate was the calcined body formed in (1-1-4), the same calcined body was used as the second substrate.

(1-4) Cofiring of Ceramic Substrates and Electrode

The layered body formed in (1-3) was integrated by hot-press firing in a hot pressing furnace under the same conditions described in (1-1-3) to manufacture a ceramic structure. Table 1 lists the firing temperature (maximum temperature) in each experimental example.

(2) Evaluation Items of Ceramic Structure (2-1) Thermal Expansion Coefficient (2-1-1) Thermal Expansion Coefficient of Components The thermal expansion coefficients of WC, Ru, and the RuAl alloy were determined by hot-press firing the commercially available powders used in the heater electrode under almost the same conditions as in (1-1-3) to form bulk materials and measuring the thermal expansion coefficients of the bulk materials by a method according to JIS-R1618 at a temperature in the range of 40° C. to 1000° C. The thermal expansion coefficient of AlN was measured with a sintered body sample cut from an AlN ceramic substrate by a method according to JIS-R1618 at a temperature in the range of 40° C. to 1000° C.

(2-1-2) Thermal Expansion Coefficient of Heater Electrode

The thermal expansion coefficient of the heater electrode at a temperature in the range of 40° C. to 1000° C. was determined by calculation based on the thermal expansion coefficients of the components measured at a temperature in the range of 40° C. to 1000° C. in (2-1-1) and the composition of the heater electrode.

(2-2) Resistivity of Heater Electrode

A test specimen was cut from the ceramic structure such that the test specimen was a rectangular parallelepiped approximately 9 mm in width, 9 mm in length, and 9 mm in thickness and included the electrode approximately 5 mm in width and 9 mm in length at the center thereof. The end faces of the electrode were exposed at a width of 5 mm on both end faces of the test specimen. The width and thickness of the electrode were measured with an optical microscope to determine the cross-sectional area S ($cm^2$) of each electrode end face. The length L (cm) of the electrode was measured with a vernier caliper and was used to calculate resistivity. A circuit for measuring electrical resistance was formed by applying an electrically conductive paste to both end faces of the electrode and coupling a lead wire to the electrically conductive paste. While a small electric current I (mA) in the range of 0 to 150 mA was passed through the lead wire in the air at roan temperature, a low voltage V (MV) was measured. The electrical resistance R (Ω) of the electrode was calculated from R=V/I. The electric resistivity ρ (Ωcm) of the electrode was calculated from ρ=R×S/L. The resistivity of the electrode in each experimental example was the average of 4 to 6 measurements.

(2-3) Microstructure of Ceramic Structure

A section of the ceramic structure thus manufactured on which the electrode was exposed was mirror-polished and was subjected to the microstructure observation and mapping analysis of the interface and periphery of the electrode and ceramic substrates with a scanning electron microscope (SEM) and an electron probe microanalyzer (EPMA).

(2-4) Components in Electrode

One of the ceramic substrates was removed from the ceramic structure to expose an electrode surface. After the electrode surface was polished, the crystal phase of the electrode was identified with an X-ray diffractometer (XRD). The measurement conditions included CuKα, 40 kV, 40 mA, 2θ=5 to 70 degrees, and a measurement step width of 0.02 degrees.

(3) Evaluation Results of Ceramic Structure

The evaluation results of each experimental example will be described below. The first substrate and the second substrate were the sintered body and the formed body in Experimental Examples 1 to 22 and the calcined body and the calcined body in Experimental Examples 23 to 25. Table 1 summarizes the compositions and characteristics of the AlN ceramic substrates and heater electrode used in each experimental example.

TABLE 1

| | AlN Ceramic Substrate | | | | Heter Electrode Main Component | |
|---|---|---|---|---|---|---|
| | First Substrate (Lower Side) | Second Substrate (Upper Side) | Aid $Y_2O_3$ (wt %) | CTE[X1] (ppm/° C.) | Kind | CTE[X1] (ppm/° C.) |
| Experimental Example 1 | AlN Sintered Body | AlN Formed Body | 5.0 | 5.70 | WC | 5.31 |
| Experimental Example 2 | AlN Sintered Body | AlN Formed Body | 5.0 | 5.70 | WC | 5.31 |
| Experimental Example 3 | AlN Sintered Body | AlN Formed Body | 5.0 | 5.70 | WC | 5.31 |
| Experimental Example 4 | AlN Sintered Body | AlN Formed Body | 5.0 | 5.70 | WC | 5.31 |
| Experimental Example 5 | AlN Sintered Body | AlN Formed Body | 5.0 | 5.70 | WC | 5.31 |
| Experimental Example 6 | AlN Sintered Body | AlN Formed Body | 5.0 | 5.70 | WC | 5.31 |
| Experimental Example 7 | AlN Sintered Body | AlN Formed Body | 5.0 | 5.70 | WC | 5.31 |
| Experimental Example 8 | AlN Sintered Body | AlN Formed Body | 5.0 | 5.70 | WC | 5.31 |
| Experimental Example 9 | AlN Sintered Body | AlN Formed Body | 5.0 | 5.70 | WC | 5.31 |
| Experimental Example 10 | AlN Sintered Body | AlN Formed Body | 5.0 | 5.70 | WC | 5.31 |
| Experimental Example 11 | AlN Sintered Body | AlN Formed Body | 5.0 | 5.70 | WC | 5.31 |
| Experimental Example 12 | AlN Sintered Body | AlN Formed Body | 5.0 | 5.70 | WC | 5.31 |
| Experimental Example 13 | AlN Sintered Body | AlN Formed Body | 5.0 | 5.70 | WC | 5.31 |
| Experimental Example 14 | AlN Sintered Body | AlN Formed Body | 5.0 | 5.70 | WC | 5.31 |
| Experimental Example 15 | AlN Sintered Body | AlN Formed Body | 5.0 | 5.70 | WC | 5.31 |
| Experimental Example 16 | AlN Sintered Body | AlN Formed Body | 5.0 | 5.70 | WC | 5.31 |
| Experimental Example 17 | AlN Sintered Body | AlN Formed Body | 5.0 | 5.70 | WC | 5.31 |
| Experimental Example 18 | AlN Sintered Body | AlN Formed Body | 5.0 | 5.70 | WC | 5.31 |
| Experimental Example 19 | AlN Sintered Body | AlN Formed Body | 5.0 | 5.70 | WC | 5.31 |
| Experimental Example 20 | AlN Sintered Body | AlN Formed Body | 5.0 | 5.70 | WC | 5.31 |
| Experimental Example 21 | AlN Sintered Body | AlN Formed Body | 0.0 | 5.50 | WC | 5.31 |
| Experimental Example 22 | AlN Sintered Body | AlN Formed Body | 0.5 | 5.50 | WC | 5.31 |
| Experimental Example 23 | AlN Calcined Body | AlN Calcined Body | 5.0 | 5.70 | WC | 5.31 |
| Experimental Example 24 | AlN Calcined Body | AlN Calcined Body | 5.0 | 5.70 | WC | 5.31 |
| Experimental Example 25 | AlN Calcined Body | AlN Calcined Body | 5.0 | 5.70 | WC | 5.31 |

| | Heter Electrode | | | | | |
|---|---|---|---|---|---|---|
| | Metal Filler | | | | | |
| | Kind | Additive Amount (Vol %) | CTE[X1] (ppm/° C.) | CTE of Heter Electrode[X1] (ppm/° C.) | Firing Temperature (° C.) | \|ΔCTE\|[X2] (ppm/K) | Resistivity of Electrode (×10⁻⁵ Ωcm) |
| Experimental Example 1 | Ru | 2.5 | 7.64 | 5.35 | 1825 | 0.35 | 2.2 |
| Experimental Example 2 | Ru | 7.5 | 7.64 | 5.47 | 1825 | 0.23 | 2.5 |
| Experimental Example 3 | Ru | 16 | 7.64 | 5.66 | 1825 | 0.04 | 3.0 |
| Experimental Example 4 | RuAl | 1.2 | 10.3 | 5.35 | 1825 | 0.35 | 2.0 |
| Experimental Example 5 | RuAl | 4.0 | 10.3 | 5.49 | 1825 | 0.21 | 2.1 |
| Experimental Example 6 | RuAl | 8.2 | 10.3 | 5.70 | 1825 | 0.00 | 2.3 |
| Experimental Example 7 | RuAl | 12 | 10.3 | 5.89 | 1825 | 0.19 | 2.5 |
| Experimental Example 8 | RuAl | 15 | 10.3 | 6.04 | 1825 | 0.34 | 3.0 |
| Experimental Example 9 | RuAl | 4.0 | 10.3 | 5.49 | 1850 | 0.21 | 2.0 |
| Experimental Example 10 | RuAl | 8.2 | 10.3 | 5.70 | 1850 | 0.00 | 2.3 |
| Experimental Example 11 | RuAl | 12 | 10.3 | 5.89 | 1850 | 0.19 | 2.4 |
| Experimental Example 12 | RuAl | 15 | 10.3 | 6.04 | 1850 | 0.34 | 2.8 |
| Experimental Example 13 | RuAl | 4.0 | 10.3 | 5.49 | 1800 | 0.21 | 2.2 |
| Experimental Example 14 | RuAl | 8.2 | 10.3 | 5.70 | 1800 | 0.00 | 2.4 |
| Experimental Example 15 | RuAl | 12 | 10.3 | 5.89 | 1800 | 0.19 | 2.4 |
| Experimental Example 16 | RuAl | 15 | 10.3 | 6.04 | 1800 | 0.34 | 2.9 |
| Experimental Example 17 | RuAl | 4.0 | 10.3 | 5.49 | 1750 | 0.21 | 2.1 |
| Experimental Example 18 | RuAl | 8.2 | 10.3 | 5.70 | 1750 | 0.00 | 2.3 |
| Experimental Example 19 | RuAl | 12 | 10.3 | 5.89 | 1750 | 0.19 | 2.5 |
| Experimental Example 20 | RuAl | 15 | 10.3 | 6.04 | 1750 | 0.34 | 3.0 |
| Experimental Example 21 | RuAl | 4.2 | 10.3 | 5.50 | 1900 | 0.00 | 1.9 |
| Experimental Example 22 | RuAl | 4.2 | 10.3 | 5.50 | 1900 | 0.00 | 1.8 |
| Experimental Example 23 | RuAl | 4.0 | 10.3 | 5.49 | 1825 | 0.21 | 2.0 |
| Experimental Example 24 | RuAl | 8.2 | 10.3 | 5.70 | 1825 | 0.00 | 2.2 |
| Experimental Example 25 | RuAl | 12 | 10.3 | 5.89 | 1825 | 0.19 | 2.3 |

[X1]CTE represents the thermal expansion coefficient at the temperature in the range of 40° C. to 1000° C.
[X2]|ΔCTE|represents the absolute value of the difference between the thermal expansion coefficient of the AlN ceramic substrate and the thermal expansion coefficient of the heater electrode at the temperature in the range of 40° C. to 1000° C.

Experimental Examples 1 to 3

Figure 4:
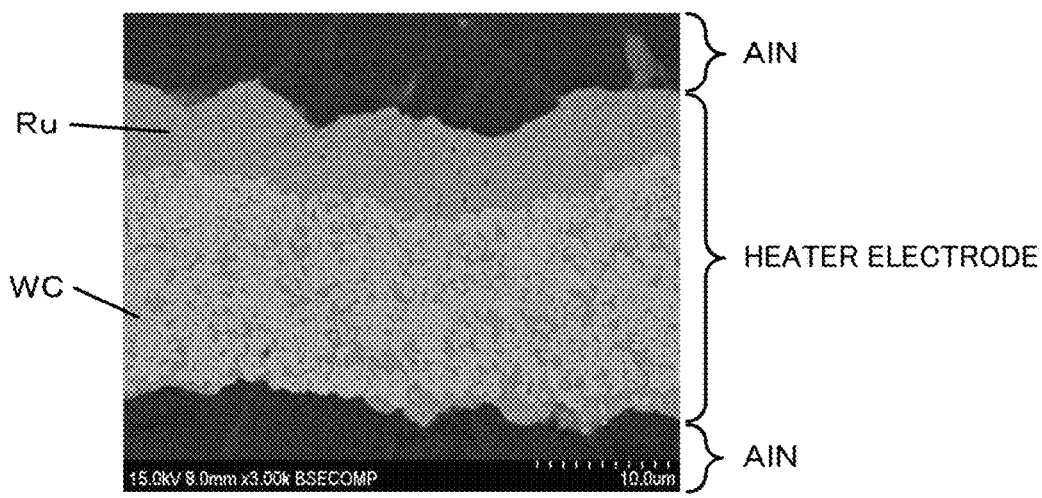
FIG. 4 is a cross-sectional SEM photograph of Experimental Example 3.

In Experimental Examples 1 to 3, the material of the heater electrode was a WC/Ru composite material, in which Ru was added to the main component WC. The thermal expansion coefficient of Ru was measured to be 7.64 ppm/° C., which was greater than the thermal expansion coefficient of AlN or WC. According to literature, Ru has a low resistivity of $8 \times 10^{-6}$ Ωcm at roman temperature. The electrode composition was WC/2.5% by volume Ru (which means that the volume of Ru is 2.5% of the total volume) in Experimental Example 1, WC/7.5% by volume Ru in Experimental Example 2, or WC/16% by volume Ru in Experimental Example 3. The first substrate, the electrode paste, and the second substrate were stacked in this order and were fired in a nitrogen atmosphere at a pressing pressure of 200 kgf/cm² and at a maximum temperature of 1825° C. for 4 hours to prepare a sample of each experimental example. In Experimental Example 1, the heater electrode had a thermal expansion coefficient of 5.35 ppm/° C., and the absolute value of difference |ΔCTE| between the thermal expansion coefficient of AlN and the thermal expansion coefficient of the heater electrode was as small as 0.35 ppm/° C. The heater electrode had a low resistivity of $2.2 \times 10^{-5}$ Ωcm, which was similar to the resistivity of WC alone ($2.1 \times 10^{-5}$ Ωcm, see Comparative Example 4). Although the Ru content was increased in Experimental Examples 2 and 3, the |ΔCTE| was 0.23 and 0.04 ppm/° C., respectively, indicating that the thermal expansion coefficient of the heater electrode was closer to the thermal expansion coefficient of AlN, and the resistivity was still as low as $2.5 \times 10^{-5}$ and $3.0 \times 10^{-5}$ Ωcm, respectively. Thus, the additive amount of Ru in the range of 2.5% to 16% by volume can result in a decreased |ΔCTE| and low resistivity. In Experimental Examples 1 to 3, a cross-sectional observation was performed with a SEM. As a result, although no crack was observed at or near the interface, and the buried structure was satisfactory in the AlN ceramic substrates, a difference in composition was observed between the upper portion and the lower portion of the heater electrode (see FIG. 4). More specifically, in FIG. 4, the transverse bright portion is the heater electrode, and the upper and lower dark portions are the AlN ceramic sintered bodies. In the heater electrode in FIG. 4, the whitish portion is WC, and the light gray portion is Ru. FIG. 4 shows that the lower layer contained much WC, and the upper light gray layer contained much Ru. Thus, in the experimental examples in which only Ru was used as filler, the thermal expansion coefficient in the heater electrode was probably more or less nonuniform.

Experimental Examples 4 to 8

Figure 5:
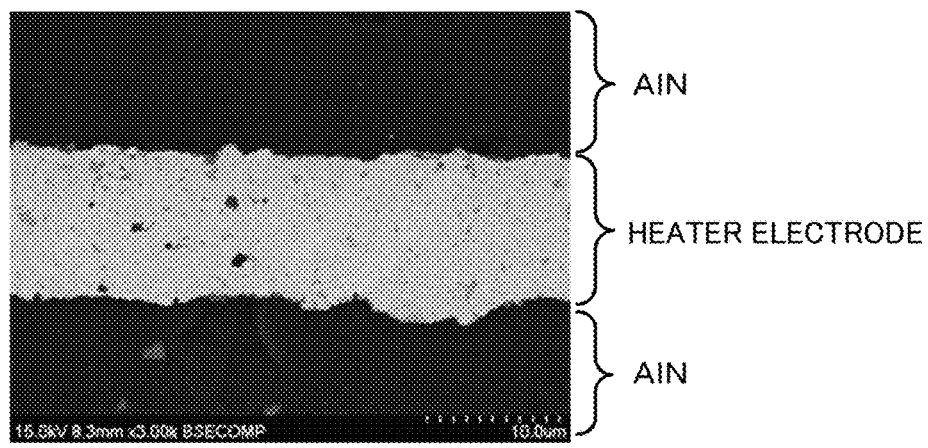
FIG. 5 is a cross-sectional SEM photograph of Experimental Example 6.

In Experimental Examples 4 to 8, the material of the heater electrode was a WC/RuAl composite material, in which RuAl was added to WC. The thermal expansion coefficient of RuAl was measured to be 10.3 ppm/° C., which was still greater than the thermal expansion coefficient of Ru. Thus, the addition of RuAl in a smaller amount than Ru can increase the thermal expansion coefficient of the WC electrode, and RuAl can be more readily adapted to the AlN ceramic substrates. The |ΔCTE| was 0.35 ppm/° C. or less in all the experimental examples. The resistivity was $3.0 \times 10^{-5}$ Ωcm or less in all the experimental examples. Thus, the additive amount of RuAl in the range of 1.2% to 15% by volume can result in a decreased |ΔCTE| and low resistivity. A cross-sectional observation with a SEM showed no crack at or near the interface and, unlike the addition of Ru alone, showed no layer structures having different compositions in the heater electrode. As a representative, a cross-sectional SEM photograph of Experimental Example 6 is shown in FIG. 5. In FIG. 5, the transverse bright portion is the heater electrode, and the upper and lower dark portions are the AlN ceramic sintered bodies. In the photograph, gray dispersed phases submicron to approximately 2 micrometers in size were observed in the heater electrode, which was shown as a bright portion. An element mapping analysis with an EPMA showed that the gray dispersed phases matched the distribution of Ru and Al. Furthermore, an electrode surface of a fired sample of Experimental Example 6 was exposed and was subjected to XRD measurement, which showed that the electrode material contained WC and RuAl, and Ru was not identified as a crystal phase except RuAl. These results show that RuAl crystals are dispersed in the WC electrode material and can act to control the thermal expansion coefficient of the electrode material. These results show that the addition of approximately 1.2% to 15% by volume of RuAl to WC as filler was an optimum method.

Experimental Examples 9 to 22

In Experimental Examples 9 to 12, the additive amounts of RuAl in the WC/RuAl composite material were 4.0%, 8.2%, 12%, and 15% by volume, and firing was performed at 1850° C. In Experimental Examples 13 to 16, the additive amounts of RuAl in the WC/RuA composite material were 4.0%, 8.2%, 12%, and 15% by volume, and firing was performed at 1800° C. In Experimental Examples 17 to 20, the additive amounts of RuAl in the WC/RuAl composite material were 4.0%, 8.2%, 12%, and 15% by volume, and firing was performed at 1750° C. In Experimental Examples 21 and 22, the $Y_2O_3$ contents of the AlN gas were 0% and 0.5% by weight, respectively, the additive amount of RuAl in the WC/RuAl composite material was 4.2% by volume, and firing was performed at 1900° C. As a result, the resistivity ranged from $2.0 \times 10^{-5}$ to $2.2 \times 10^{-5}$ Ωcm at a RuAl additive amount of 4.0% by volume, $2.3 \times 10^{-5}$ to $2.4 \times 10^{-5}$ Ωcm at a RuAl additive amount of 8.2% by volume, $2.4 \times 10^{-5}$ to $2.5 \times 10^{-5}$ Ωcm at a RuAl additive amount of 12% by volume, or $2.8 \times 10^{-5}$ to $3.0 \times 10^{-5}$ Ωcm at a RuAl additive amount of 15% by volume. Even when the firing temperature varied in this way, the resistivity was maintained at as low as $3.0 \times 10^{-5}$ Ωcm or less.

Experimental Examples 23 to 25

In Experimental Examples 23 to 25, the first and second substrates were AlN calcined bodies, the additive amounts of RuAl in the WC/RuAl composite material were 4.0%, 8.2%, and 12% by volume, the firing temperature was 1825° C., and except for these firing was performed by the method described in (1-1-3). As a result, the resistivity ranged from 2.0 to $2.3 \times 10^{-5}$ and was as small as $3.0 \times 10^{-5}$ Ωcm or less. It has been confirmed also in the cross-sectional observation with the SEM and EPMA as well as the crystal phase analysis with the XRD that these structures were similar to the structure exemplified by Experimental Example 6. Even where the AlN substrates before firing were the calcined bodies, the WC/RuAl composite electrode material can provide an AlN ceramic structure with good characteristics.

Comparative Examples 1 to 4

The material of the heater electrode was Mo in Comparative Example 1, $Mo_2C$ in Comparative Example 2, W in Comparative Example 3, or WC in Comparative Example 4. No filler was added in Comparative Examples 1 to 4. Table 2 shows the results. When the main component of the heater electrode was Mo or $Mo_2C$, as in Comparative Example 1 or 2, the |ΔCTE| was 0.41 or 1.14 ppm/° C. and exceeded 0.35 ppm/° C. When the main component of the heater electrode was W, as in Comparative Example 3, the was 0.41 ppm/° C. and exceeded 0.35 ppm/° C. When the ceramic structure of Comparative Example 3 was formed three times, the resistivities of the three structures varied considerably from 2.0 to $3.6 \times 10^{-5}$ Ωcm. A cross-sectional observation of the material of Comparative Example 3 showed that the electrode material was partly carbonized, and the degree of carbonization varied from sample to sample. Thus, the heterogeneity of these electrode materials is probably responsible for variations in resistivity. In the case where the material of the heater electrode was WC, as in Comparative Example 4, the resistivity was as low as $2.1 \times 10^{-5}$ Ωcm, but the |ΔCTE| was 0.39 ppm/° C. and exceeded 0.35 ppm/° C. In Comparative Examples 1 to 4, no heater electrode had both a thermal expansion coefficient similar to the thermal expansion coefficient of the AlN ceramic substrates and low resistivity.

TABLE 2

| | AlN Ceramic Substrate | | | Heter Electrode | | | Firing | |ΔCTE|[X2] | Resistivity of |
| | First Substrate (Lower Side) | Second Substrate (Upper Side) | CTE[X1] (ppm/° C.) | Electrode Component | Additive Component | CTE[X1] (ppm/° C.) | Temperature (° C.) | (ppm/K) | Electrode (×10$^{-5}$ Ωcm) |
|---|---|---|---|---|---|---|---|---|---|
| Comparative Example 1 | AlN Sintered Body | AlN Formed Body | 5.70 | Mo | Not Added | 6.11 | 1825 | 0.41 | 5.1 |
| Comparative Example 2 | AlN Sintered Body | AlN Formed Body | 5.70 | Mo$_2$C | Not Added | 6.84 | 1825 | 1.14 | 10.4 |
| Comparative Example 3 | AlN Sintered Body | AlN Formed Body | 5.70 | W | Not Added | 5.29 | 1825 | 0.41 | 2.0~3.6 |
| Comparative Example 4 | AlN Sintered Body | AlN Formed Body | 5.70 | WC | Not Added | 5.31 | 1825 | 0.39 | 2.1 |

[X1]CTE represents the thermal expansion coefficient at the temperature in the range of 40° C. to 1000° C.
[X2]|ΔCTE|represents the absolute value of the difference between the thermal expansion coefficient of the AlN ceramic substrate and the thermal expansion coefficient of the heater electrode at the temperature in the range of 40° C. to 1000° C.

The present invention is not limited to the above example. It is appreciated that the present invention can be embodied in various modes so long as these are within the technical scope of the present invention.

The present application claims priority from Japanese Patent Application No. 2016-037658 filed on Feb. 29, 2016, the entire contents of which are incorporated herein by reference.

What is claimed is:

1. A ceramic structure including a heater electrode on a surface of or within an AlN ceramic substrate containing 50% or more by volume of AlN as a main component,
wherein the heater electrode contains WC as a main component and, in addition, a metal filler, the metal filler has a lower resistivity and a higher thermal expansion coefficient than AlN,
an absolute value of a difference between a thermal expansion coefficient of the AlN ceramic substrate and a thermal expansion coefficient of the heater electrode at a temperature in a range of 40° C. to 1000° C. is 0.35 ppm/° C. or less.

2. The ceramic structure according to claim 1, wherein the metal filler is Ru or a Ru alloy.

3. The ceramic structure according to claim 1, wherein the metal filler is RuAl.

4. The ceramic structure according to claim 1, wherein the heater electrode has a resistivity of $3.0 \times 10^{-5}$ Ωcm or less at a room temperature.

5. A member for a semiconductor manufacturing apparatus including the ceramic structure according to claim 1.

6. A method for manufacturing a ceramic structure including:
placing a heater electrode containing WC as a main component and, in addition, a metal filler on a surface of a first substrate of an AlN sintered body, calcined body, or formed body each containing 50% or more by volume of AlN as a main component,
placing a second substrate of AlN sintered body, calcined body, or formed body, each containing 50% or more by volume of AlN as a main component thereon to form a layered body, and hot-press firing the layered body to form the ceramic structure,
wherein the metal filler has a lower resistivity and a higher thermal expansion coefficient than AlN, and an absolute value of a difference between a thermal expansion coefficient of the AlN ceramic substrate and a thermal expansion coefficient of the heater electrode at a temperature in a range of 40° C. to 1000° C. is 0.35 ppm/° C. or less.

7. The method for manufacturing a ceramic structure according to claim 6,
wherein the metal filler is Ru or Ru alloy, and the amount of the metal filler is determined such that an absolute value of a difference between a thermal expansion coefficient of the AlN ceramic substrate and a thermal expansion coefficient of the heater electrode at a temperature in a range of 40° C. to 1000° C. is 0.35 ppm/° C. or less.

* * * * *